United States Patent
Koh

(10) Patent No.: US 7,217,602 B2
(45) Date of Patent: May 15, 2007

(54) SEMICONDUCTOR DEVICE EMPLOYING SOI SUBSTRATE AND METHOD OF MANUFACTURING THE SAME

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/891,626

(22) Filed: Jul. 15, 2004

(65) Prior Publication Data

US 2005/0040462 A1   Feb. 24, 2005

(30) Foreign Application Priority Data

Jul. 23, 2003   (KR) .................... 10-2003-0050639

(51) Int. Cl.
*H01L 21/00*   (2006.01)
(52) U.S. Cl. ..................... 438/149; 438/479; 438/517
(58) Field of Classification Search ................ 257/344, 257/347, 408, 288; 438/149, 479, 517, 197
See application file for complete search history.

(56) References Cited

U.S. PATENT DOCUMENTS 5,736,435 A * 4/1998 Venkatesan et al. ........ 438/151

| | | | |
|---|---|---|---|
| 6,313,507 B1 | 11/2001 | Lee | |
| 6,541,822 B2 | 4/2003 | Bae et al. | |
| 6,573,563 B2 | 6/2003 | Lee et al. | |
| 2003/0218193 A1* | 11/2003 | Hayashi et al. ............. | 257/288 |

* cited by examiner

*Primary Examiner*—Douglas W. Owens
(74) *Attorney, Agent, or Firm*—Andrew D. Fortney

(57) ABSTRACT

A semiconductor device employing a PD-SOI substrate and a method of manufacturing the same are capable of minimizing a floating body effect. The semiconductor device employs a silicon layer over a buried insulating layer on a silicon wafer, isolating layers in the silicon layer in contact with the buried insulating layer, a body layer of a first conductivity type in the silicon layer between the isolating layers and having a trench, a gate insulating layer and a gate electrode in the trench of the body layer, a spacer on the sidewall of the gate electrode, LDD regions of a second conductivity type in the body layer on both sides of the gate electrode in contact with the buried insulating layer under the trench, and source and drain regions of the second conductivity type the body layer on both sides of the spacer in contact with the buried insulating layer.

9 Claims, 3 Drawing Sheets

RELATED ART

SEMICONDUCTOR DEVICE EMPLOYING SOI SUBSTRATE AND METHOD OF MANUFACTURING THE SAME

BACKGROUND OF THE INVENTION (a) Field of the Invention

The present invention relates to a semiconductor device and a method of manufacturing the same, and more particularly to a semiconductor device employing partially depleted-silicon on insulator (PD-SOI) substrate and a method of manufacturing the same.

(b) Description of the Related Art

Generally, an SOI substrate employs a silicon layer formed over an insulating layer on a silicon wafer, to have a structure in which the insulating layer is buried within the silicon layers.

Therefore, in the case of manufacturing a metal oxide silicon (MOS) transistor in this SOI substrate, body layers of the MOS transistor are isolated by the buried insulating layer and an isolating layer, and as a result, the speed and the integration density of the MOS transistor are improved.

This SOI substrate is classified into a fully depleted type (FD) and a partially depleted type (PD) based on the thickness of the silicon layer.

First, a MOS transistor employing the FD-SOI substratewill be described with reference to a FIG. 1.

As shown in FIG. 1, isolating layers 11 are formed in a silicon layer 10c of a FD-SOI substrate 10 employing the silicon layer 10c that is formed relatively thinly over a buried insulating layer 10b on a silicon wafer 10a to be in vertical contact with the buried insulating layer 10b, and a body layer 12 of a P well is formed in the silicon layer 11c between the isolating layers 11. A gate insulating layer 13 and a gate electrode 14 are sequentially formed on the body layer 12. LDD (Lightly Doped Drain) regions 15 in which low concentration impurities, for example N− are ion-implanted, are formed within the body layer 12 of both sides of the gate electrode 14 to be in contact with the buried insulating layer 10b. A spacer 16 of an insulating material is formed on the side wall of the gate electrode 14. Source and drain regions 17 in which high concentration impurities, for example N+ are ion-implanted, are formed within the body layer 12 of both sides of the spacer 16 to be in contact with the buried insulating layer 10b.

Thus, in the MOS transistor employing the FD-SOI substrate, as the LDD regions 15 and the source and drain regions 17 are formed within the body layer 12 to be in contact with the buried insulating layer 10b by the thin silicon layer 10c, a depletion layer is fully formed in the body layer 12 when a back bias voltage is not applied to the body layer 12.

Next, a MOS transistor employing the PD-SOI substratewill be described with reference to a FIG. 2.

As shown in FIG. 2, isolating layers 21 are formed in a silicon layer 20c of a PD-SOI substrate 20 employing the silicon layer 20c that is formed relatively thickly over a buried insulating layer 20b to be in vertical contact with the buried insulating layer 20c, and a body layer 22 of a P well is formed in the silicon layer 20c between the isolating layers 21. A gate insulating layer 23 and a gate electrode 24 are sequentially formed on the body layer 22. LDD regions 25 in which low concentration impurities, for example N− impurities are ion-implanted, are formed within the body layer 22 of both sides of the gate electrode 24 to be separated from the buried insulating layer 20b. A spacer 26 of an insulating material is formed on the side wall of the gate electrode 24. Source and drain regions 27 in which high concentration impurities, for example N+ impurities are ion-implanted, are formed within the body layer 22 of both sides of the spacer 26 to be separated from the buried insulating layer 20b.

Thus, in the MOS transistor employing the PD-SOI substrate, as the LDD regions 25 and the source and drain regions 27 are formed within the body layer 22 to be separated from the buried insulating layer 20 by the thick silicon layer 20c, a depletion layer is partially formed in the body layer 22 when a back bias voltage is not applied to the body layer 22.

Therefore, a floating body region exists under a channel region, so that a floating body effect occurs.

This floating body effect accumulates holes generated by impact ionization of electrons around a drain region in the floating body region, to increase the potential of the body layer and to lower a potential barrier between the source region and the body layer, thereby decreasing a threshold voltage and increasing a drain current.

Furthermore, if the potential of the body layer will be increased above 0.6V, a parasitic bipolar transistor formed by the source region/the body layer/the drain region is turned on, to break down the transistor.

In addition, if the accumulated holes are combined with a portion of electrons consisting of a driving current of the transistor when a specific driving current flows, leakage current and operation errors occur.

To preventing the floating body effect, the following three methods are proposed.

A first method prevents the body floating effect by forming a body contact on the MOS transistor and connecting it to ground. However, since a potential of the body layer is maintained at 0V and a voltage of the source region increases in the case of employing the body contact to the MOS transistor, a reverse bias is applied to the source region and the body region respectively, to increase a threshold voltage and to decrease a drain current, thereby deteriorating the performance of the MOS transistor. Furthermore, since the MOS transistor requires an additional region to form the body contact, there is a problem that its size increases A second method prevents the body floating effect by forming point defects as a life time killer in the source and drain regions. However, as Ar or Ge ions are implanted into the silicon layer by ion-implantation to form the point defects, there is problem in that the surface of the silicon layer is damaged by the ions.

A third method prevents the body floating effect by forming a narrow band gap source in the source and drain regions using a SiGe epitaxial process. However, there is problem in that it is difficult to perform the epitaxial process.

SUMMARY OF THE INVENTION

An object of the present invention is to provide a semiconductor device employing a PD-SOI substrate that is capable of minimizing the above floating body effect.

Another object of the present invention is to provide a method of manufacturing the semiconductor device as described above.

The object of the present invention as noted above is accomplished by a semiconductor device employing a PD-SOI substrate including an SOI substrate employing a silicon layer formed over a buried insulating layer on a silicon wafer, isolating layers formed in the silicon layer to be in contact with the buried insulating layer, a body layer of a first conductivity type formed in the silicon layer between the isolating layers and having a trench, a gate insulating layer and a gate electrode sequentially formed on the trench of the body layer, a spacer formed on the sidewall of the gate electrode, LDD regions of a second conductivity type formed within the body layer of both sides of the gate electrode to be in contact with the buried insulating layer under the trench, and source and drain regions of the second conductivity type formed within the body layer of both sides of the spacer to be in contact with the buried insulating layer.

Furthermore, the object of the present invention as noted above is accomplished by a method of manufacturing a semiconductor device employing a PD-SOI substrate including providing a SOI substrate employing a silicon layer formed over a buried insulating layer on a silicon wafer, forming isolating layers in the silicon layer to be in contact with the buried insulating layer, forming a body layer of a first conductivity type in the silicon layer between the isolating layers, forming a trench in the body layer, forming a gate insulating layer on the entire surface of the trench, forming a gate electrode on the gate insulating layer, forming LDD regions of a second conductivity type within the body layer of both sides of the gateto be in contact with the buried insulating layer under the trench, forming a spacer on the side wall of the gate electrode, and forming source and drains regions of the second conductivity type within the body layer of both sides of the spacer to be in contact with the buried insulating layer.

DETAILED DESCRIPTION OF THE PREFERRED EMBODIMENTS

The present invention will now be described more fully hereinafter with reference to the accompanying drawing, in which preferred embodiments of the invention are shown. This invention may, however, be embodied in many different forms and should not be construed as being limited to the embodiments set forth herein.

First, a MOS transistor employing a PD-SOI substrate according to an embodiment of the present invention will be described with reference to FIG. 3.

Figure 1:
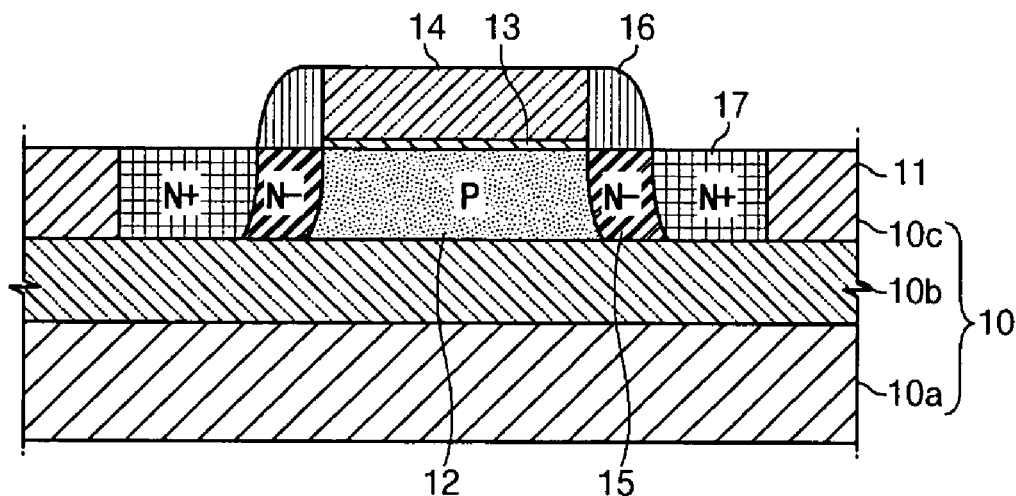
FIG. 1 is a cross-sectional view showing a conventional MOS transistor employing a FD-SOI substrate.
Figure 2:
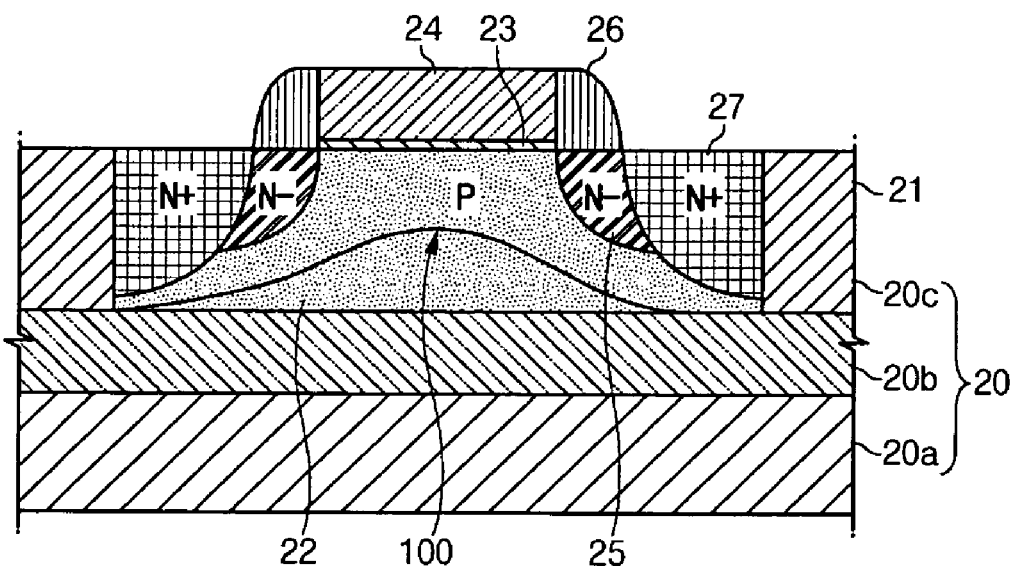
FIG. 2 is a cross-sectional view showing a conventional MOS transistor employing a PD-SOI substrate.
Figure 3:
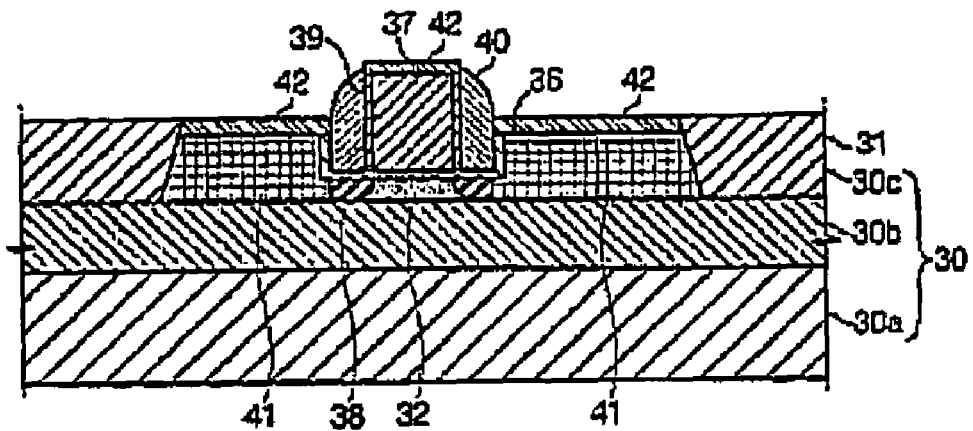
FIG. 3 is a cross-sectional view showing a MOS transistor employing a PD-SOI substrate according to an embodiment of the present invention.

As shown in FIG. 3, isolating layers 31 are formed in a silicon layer 30c of a PD-SOI substrate 30 employing the silicon layer 30c that that is formed relatively thickly over a buried insulating layer 30b on a silicon wafer 30a to be in vertical contact with the buried insulating layer 30b, and a body layer 32 of a P well having a trench 35 is formed in the silicon layer 30c between the isolating layers 31. The trench 35 is formed to be separated from the buried insulating layer 30 by a predetermined space, preferably 100 Å–500 Å. The body layer 32 is electrically isolated from an adjacent body layer by the isolating layers 31 and the buried insulating layer 30b.

A gate insulating layer 36 is formed on the entire surface of the trench 35 and a gate electrode 37 is formed on the gate insulating layer 36. A spacer 40 of an insulating material is formed on the side wall of the gate electrode 37 to be in contact with the gate insulating layer 36 on the side portion of the trench 35, and a buffer insulating layer 39 is interposed between the gate electrode 37 and the spacer 40. LDD regions 38 are formed within the body layer 32 on both sides of the gate 37 to be in contact with the buried insulating layer 30b under the trench 35, and source and drain regions 41 are formed within the body layer 32 to be in contact with the buried insulating layer 30b. Silicide layers 42 are formed on the surfaces of the gate electrode 37 and the LDD regions 38.

In the MOS transistor employing the PD-SOI substrate according to this embodiment, as the trench 35 is formed in the body layer 32 to be separated from the buried insulating layer 30b and the gate insulating layer 36 and the gate electrode 37 are on the trench 35, a channel will be relatively thinly formed in the body layer 32.

Furthermore, as the LDD regions 38 and the source and drain regions 41 are in contact with the buried insulating layer 30b, the MOS transistor employing the PD-SOI substrate will be similar to the structure of a MOS transistor employing an FD-SOI substrate. Therefore, a depletion layer is formed fully in the body layer 32, so that a floating body effect can minimized.

Next, a method of manufacturing the above MOS transistor employing the PD-SOI substrate will be described with reference to FIGS. 4A–4E.

Figure 4A:
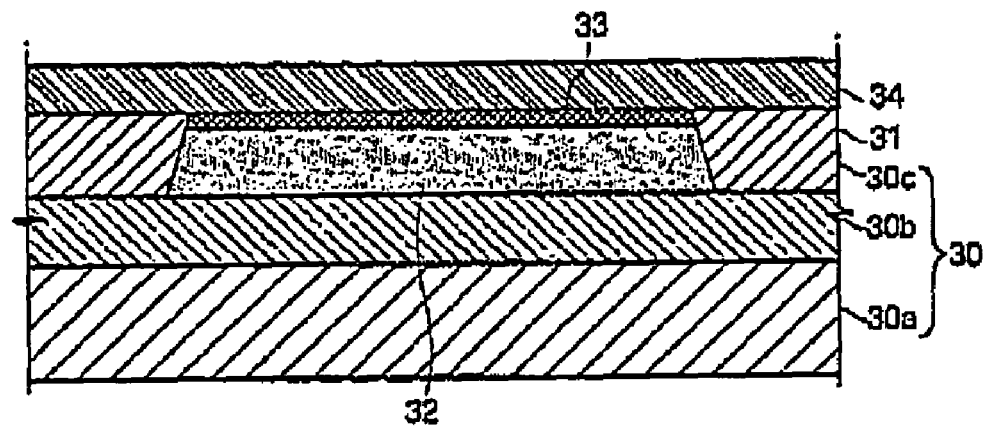
FIGS. 4A–4E are cross-sectional views for describing a method of manufacturing the MOS transistor shown in FIG. 3.

As shown in FIG. 4A, a PD-SOI substrate 30 employing a silicon layer 30c formed relatively thickly over a buried insulating layer 30b on a silicon wafer 30a is provided, and isolating layers 31 are formed in the silicon layer 30c of the PD-SOI substrate 30 by a shallow trench isolation (STI) process. A body layer 32 of a P well is then formed between the isolating layers 31, and a pad oxide layer 33 of a silicon oxide ($SiO_2$) is formed thinly on the surface of the body layer. Thereafter, a pad nitride layer 34 of silicon nitride ($Si_3N_4$) is thickly formed on the pad oxide layer 33 and the isolating layer 31.

Figure 4B:
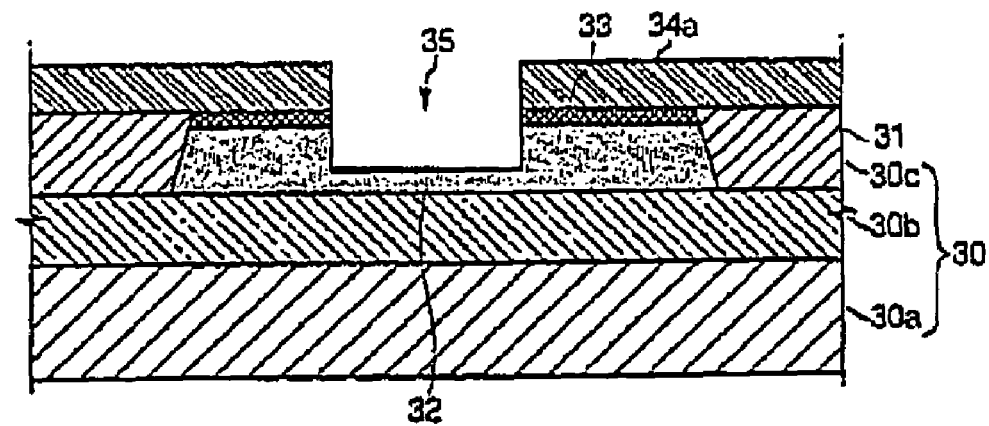

As shown in FIG. 4B, the pad nitride layer 34 and the pad oxide layer 33 are patterned by photolithography and etching processes to form a hard mask 34a exposing a portion of the body layer 32. The exposed portion of the body layer 32 is then etched by a etching process using the hard mask 34a to form a trench 35. At this time, the etching process is preformed so that the trench is formed to be separated from the buried insulating layer 30b by a predetermined space, preferably 100 Å–500 Å.

Figure 4C:
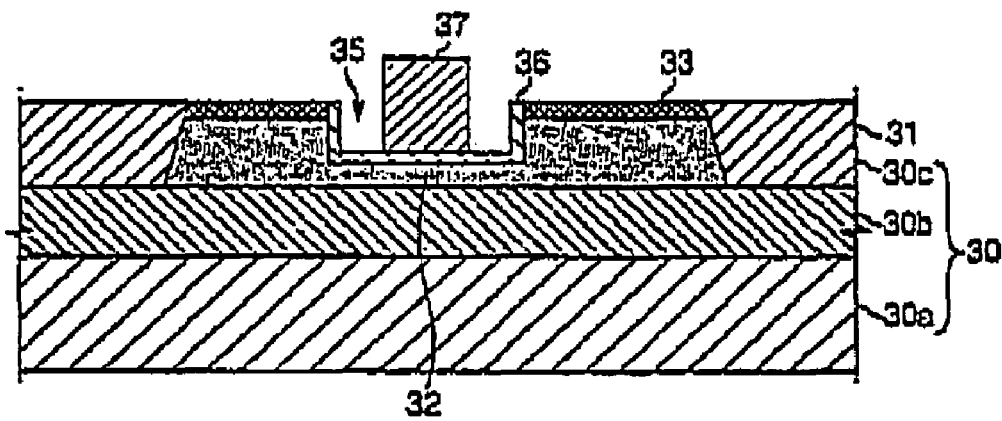

As shown in FIG. 4C, the hard mask 34a is removed, a gate insulating layer 36 of silicon oxide is formed on the surface of the trench 35, and a gate electrode 37 of doped polysilicon is formed on the gate insulating layer 26.

Figure 4D:
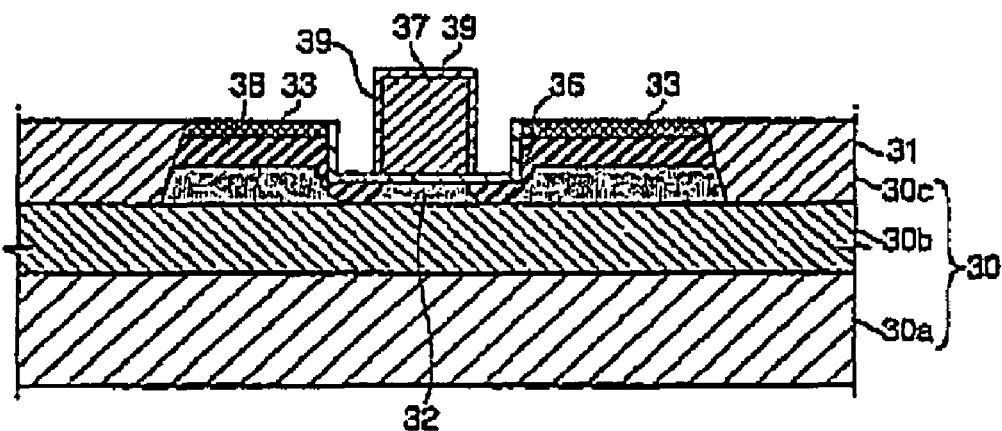

As shown in FIG. 4D, low concentration impurities, for example N− impurities are ion-implanted into the silicon layer 30c, to form LDD regions 38 within the body layer 32 being in contact with the buried insulating layer 30b under the trench 35. A buffer insulating layer 39 of silicon oxide is then formed the surface of the gate electrode 36.

Figure 4E:
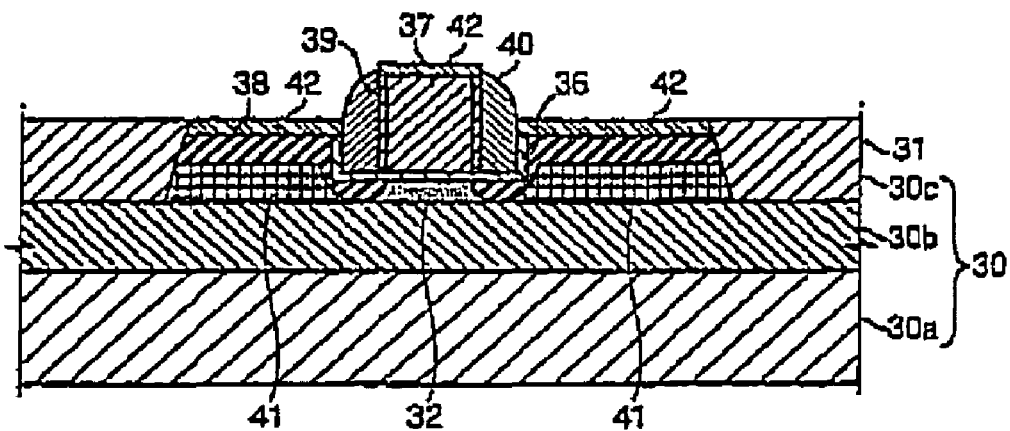

As shown in FIG. 4E, a spacer 40 of an insulating material is formed on the buffer insulating layer 39 of the side wall of the gate electrode 37 to be in contact with the gate insulating layer 36 on the side portion of the trench 35. High concentration impurities, for example N+ impurities are then ion-implanted into the silicon layer 30c, to form source and drain regions 41 within the body layer 32 to be in contact with the buried insulating layer 30b.

Thereafter, the buffer insulating layer 39 on the gate electrode 37 and the pad oxide layer 33 are removed to expose the surfaces of the gate electrode 37 and the LDD regions 38. Silicide layers 42 are formed respectively on the exposed surfaces of the gate electrode 37 and the LDD regions 38 by a silicide process.

As described in the above, the present invention has an advantage in that a floating body effect is minimized by thinly forming the channel in the body layer and forming the depletion layer fully in the body layer in a MOS transistor employing a PD-SOI substrate.

As a result, electrical properties and reliability of the MOS transistor are improved.

While the present invention has been described in detail with reference to the preferred embodiments, it is to be understood that the invention is not limited to he disclosed embodiments, but, on the contrary, is intended to cover various modifications and equivalent arrangements included within the spirit and scope of the appended claims.

What is claimed is:

1. method of manufacturing a semiconductor device comprising:
    in a SOI substrate having a silicon layer over a buried insulating layer on a silicon wafer, forming isolating layers adjacent to the silicon layer in contact with the buried insulating layer;
    forming a body layer having a first conductivity type in the silicon layer between the isolating layers;
    forming a hard mask exposing a portion of the body layer, etching the exposed portion of the body layer, and removing the hard mask to form a trench in the body layer;
    forming a gate insulating layer on the entire surface of the trench;
    forming a gate electrode on the gate insulating layer, the gate electrode being narrower than the trench;
    forming LDD regions having a second conductivity type in the body layer of both sides of the gate electrode, in contact with the buried insulating layer under the trench, and aligned to sidewalls of the gate electrode;
    forming a spacer on the sidewalls of the gate electrode;
    forming source and drain regions having the second conductivity type in the body layer of both sides of the spacer, in contact with the buried insulating layer; and
    after forming the source and drain regions, forming silicide layers on the surfaces of the gate electrode and the LDD regions.

2. The method of claim 1, wherein the trench is separated from the buried insulating layer by a predetermined space.

3. The method of claim 2, wherein the space between the trench and the buried insulating layer is 100 Å to 500 Å.

4. The method of claim 1, wherein the hard mask compries a nitride layer.

5. The method of claim 1, wherein the spacer is formed in contact with the gate insulting layer on the side portion of the trench.

6. The method of claim 1, further comprising forming a buffer insulating layer between the steps of forming the LDD regions and forming the spacer.

7. The method of claim 1, wherein the first conductive type comprises a P type and the second conductive type comprises an N type.

8. The method of claim 1, wherein the SOI substrate comprises a partially depleted type SOI substrate.

9. The method of claim 1, comprising forming the LDD regions before forming the spacer.

\* \* \* \* \*